(12) United States Patent
Liang et al.

(10) Patent No.: US 11,817,400 B2
(45) Date of Patent: Nov. 14, 2023

(54) BARIUM TITANATE FILMS HAVING REDUCED INTERFACIAL STRAIN

(71) Applicant: Psiquantum, Corp., Palo Alto, CA (US)

(72) Inventors: Yong Liang, Niskayuna, NY (US); Vimal Kumar Kamineni, Fremont, CA (US); Chia-Ming Chang, Palo Alto, CA (US); James McMahon, Palo Alto, CA (US)

(73) Assignee: Psiquantum, Corp., Palo Alto, CA (US)

( * ) Notice: Subject to any disclaimer, the term of this patent is extended or adjusted under 35 U.S.C. 154(b) by 0 days.

(21) Appl. No.: 17/377,131

(22) Filed: Jul. 15, 2021

(65) Prior Publication Data

US 2023/0018940 A1    Jan. 19, 2023

(51) Int. Cl.
*H01L 23/00* (2006.01)
*H01L 21/02* (2006.01)
*H01L 27/12* (2006.01)

(52) U.S. Cl.
CPC ...... *H01L 23/562* (2013.01); *H01L 21/02186* (2013.01); *H01L 27/1203* (2013.01)

(58) Field of Classification Search
CPC .............. H01L 23/562; H01L 27/1203; H01L 23/5256; H01L 21/02186
USPC .............................................. 257/3; 438/763
See application file for complete search history.

(56) References Cited

U.S. PATENT DOCUMENTS

2009/0104789 A1    4/2009  Mallick et al.
2022/0244583 A1*   8/2022  Liang et al. ............. G02F 1/35

FOREIGN PATENT DOCUMENTS

WO      2021077104 A1     4/2021

OTHER PUBLICATIONS

PCT/US2022/037082, "Invitation to Pay Additional Fees and, Where Applicable, Protest Fee", dated Sep. 20, 2022, 2 pages.
"Lead Zirconate Titanate", Wikipedia, Available Online at https://en.wikipedia.org/wiki/Lead_zirconate_titanate, 2004, 4 pages.
"Magnesium Oxide", Wikipedia, Available Online at https://en.wikipedia.org/wiki/Magnesium_oxide, 1986, 8 pages.
PCT/US2022/037082, "International Search Report and Written Opinion", dated Nov. 30, 2022, 11 pages.

(Continued)

*Primary Examiner* — Thinh T Nguyen
(74) *Attorney, Agent, or Firm* — Kilpatrick Townsend & Stockton LLP

(57) ABSTRACT

In some embodiments method comprises depositing a ferroelectric layer on a top surface of a semiconductor wafer and forming one or more gaps in the ferroelectric layer. The one or more gaps can be formed on a repetitive spacing to relieve stresses between the ferroelectric layer and the semiconductor wafer. A first dielectric layer is deposited over the ferroelectric layer and the first dielectric layer is planarized to fill in the gaps. A second dielectric layer is formed between the ferroelectric layer and the semiconductor wafer. The second dielectric layer can be formed by annealing the wafer in an oxidizing atmosphere such that an upper portion of the semiconductor substrate forms an oxide layer between the semiconductor substrate and the ferroelectric layer.

10 Claims, 9 Drawing Sheets

(56) References Cited

OTHER PUBLICATIONS

Sriram, et al., "Nanocolumnar Preferentially Oriented Pszt Thin Films Deposited on Thermally Grown Silicon Dioxide", Nanoscale Research Letter, vol. 4, Jan. 2009, pp. 29-33.
PCT/US2022/037082, "Invitation to Pay Additional Fees and, Where Applicable, Protest Fee", dated Oct. 31, 2022, 2 pages.

* cited by examiner

BARIUM TITANATE FILMS HAVING REDUCED INTERFACIAL STRAIN

BACKGROUND

Currently there are a wide variety of films that can be applied to semiconductor wafers. Some of these films have a different coefficient of thermal expansion (CTE) than the wafer and can delaminate or fracture, especially when applied to large wafer (e.g., 300 mm). New methods of depositing films that have a mismatched CTE with the wafer are required.

SUMMARY

Some embodiments of the present disclosure relate to methods of depositing films on wafers where the films have a different CTE than the wafer. In some embodiments a method comprises providing a silicon wafer and depositing a ferroelectric material on a top surface of the silicon wafer. One or more regions of the ferroelectric material are selectively removed along one or more dicing lanes to define one or more gaps between portions of the ferroelectric material. Flowable silicon dioxide is deposited over the ferroelectric material and into the one or more gaps. A top surface of the flowable silicon dioxide is planarized. The silicon wafer, the ferroelectric material and the flowable silicon dioxide are annealed in an oxidizing atmosphere causing an intermediate silicon dioxide layer to form between the ferroelectric material and the silicon wafer. One or more optical devices are formed on the planarized top surface of the flowable silicon dioxide.

In some embodiments the one or more regions of the ferroelectric material are selectively removed using a dicing saw or an etching process. In various embodiments the silicon wafer comprises a silicon-on-insulator series of layers. In some embodiments the ferroelectric material comprises barium titanate.

In some embodiments method comprises depositing a ferroelectric layer on a top surface of a semiconductor wafer and forming one or more gaps in the ferroelectric layer. A first dielectric layer is deposited over the ferroelectric layer and the first dielectric layer is planarized. A second dielectric layer is formed between the ferroelectric layer and the semiconductor wafer.

In some embodiments the semiconductor wafer comprises a silicon wafer. In various embodiments the one or more gaps are formed in the ferroelectric layer using a dicing saw or an etching process. In some embodiments the one or more gaps are formed in the ferroelectric layer along one or more dicing lane regions. In various embodiments the one or more gaps are formed in the ferroelectric layer within one or more active regions of one or more semiconductor die defined across the semiconductor wafer. In some embodiments the second dielectric layer is formed during a heat treating process in an oxidizing atmosphere. In various embodiments the first dielectric layer comprises flowable silicon dioxide. In some embodiments the second dielectric layer comprises silicon dioxide. In various embodiments the semiconductor wafer comprises a silicon-on-insulator series of layers. In some embodiments the ferroelectric material comprises barium titanate.

In some embodiments a wafer comprises a silicon layer, a first dielectric layer on the silicon layer and a ferroelectric layer on the first dielectric layer, wherein the ferroelectric layer defines one or more gaps between portions of the ferroelectric layer. A second dielectric layer is deposited on the first ferroelectric layer and disposed within the one or more gaps.

In some embodiments the wafer comprises a silicon-on insulator series of layers. In various embodiments the wafer further comprises an array of die regions separated by dicing lanes. In some embodiments the one or more gaps are defined along one or more of the dicing lanes. In various embodiments the one or more gaps are defined within one or more of the die regions. In some embodiments the ferroelectric material comprises barium titanate.

In some embodiments a wafer is made with a method, the method comprising the steps of depositing a ferroelectric layer on a top surface of a semiconductor wafer and forming one or more gaps in the ferroelectric layer. A first dielectric layer is deposited over the ferroelectric layer and the first dielectric layer is planarized. A second dielectric layer is formed between the ferroelectric layer and the semiconductor wafer.

Numerous benefits are achieved by way of the present invention over conventional techniques. For example, embodiments of the present invention provide the ability to deposit CTE mismatched films on wafers of any size, including 300 millimeters. The deposition of the CTE mismatched films over large wafer areas enables increased production capacity and reduced cost. These and other embodiments of the invention along with many of its advantages and features are described in more detail in conjunction with the text below and attached figures.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Techniques disclosed herein relate generally to semiconductor wafers having at least one deposited layer that has a coefficient of thermal expansion (CTE) mismatch with the bulk wafer material. More specifically, techniques disclosed herein relate to methods of forming one or more ferroelectric layers (e.g., barium titanate) on silicon wafers with reduced strain. Various inventive embodiments are described herein, including methods, processes, systems, devices, and the like.

In order to better appreciate the features and aspects of depositing CTE mismatched layers on semiconductor wafers according to the present disclosure, further context for the disclosure is provided in the following section by discussing one particular implementation of a ferroelectric barium titanate film deposited on a 300 millimeter silicon wafer, according to embodiments of the present disclosure. These embodiments are for explanatory purposes only and other embodiments may be employed in other types of deposited layers, different compositions of semiconductor wafers and/or different sizes (e.g., diameters) of semiconductor wafers. For example, embodiments of the disclosure can be used with any semiconductor wafer that can benefit from the deposition of a layer that has a mismatched coefficient of thermal expansion (CTE) with the bulk material of the wafer. In some instances, embodiments of the disclosure are particularly well suited for use with relatively large wafers (e.g., 300 mm and above) because of the difficulty of forming CTE mismatched layers on larger wafers, however the embodiments disclosed herein are in no way limited to any size or configuration of semiconductor wafer.

Figure 1:
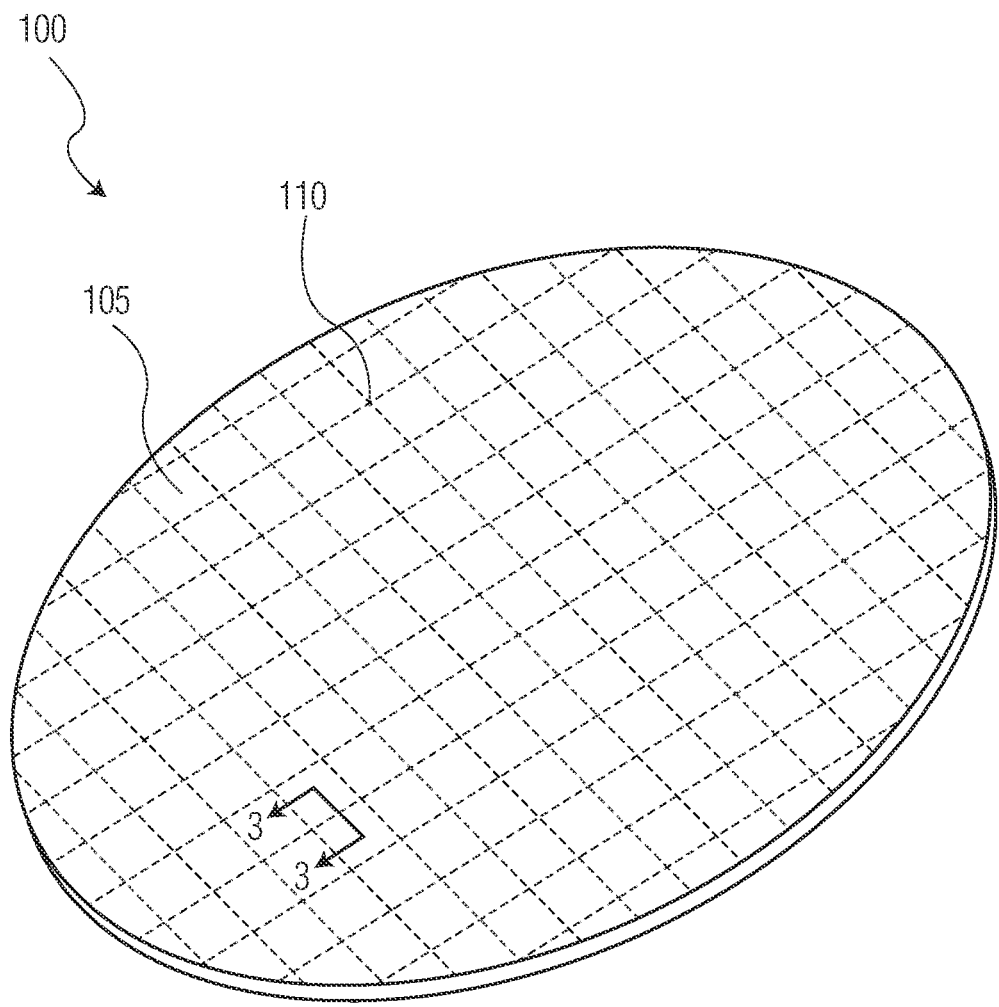
FIG. 1 is an isometric view of a semiconductor wafer, according to an embodiment of the disclosure.

FIG. 1 depicts an isometric illustrative rendering of a semiconductor wafer 100, according to some embodiments of the disclosure. As shown in FIG. 1, semiconductor wafer 100 includes a plurality of individual die 105 that will be singulated along dicing lanes 110 shown by dashed lines. A ferroelectric layer can be formed on wafer 100, as described in more detail below.

Figure 2:
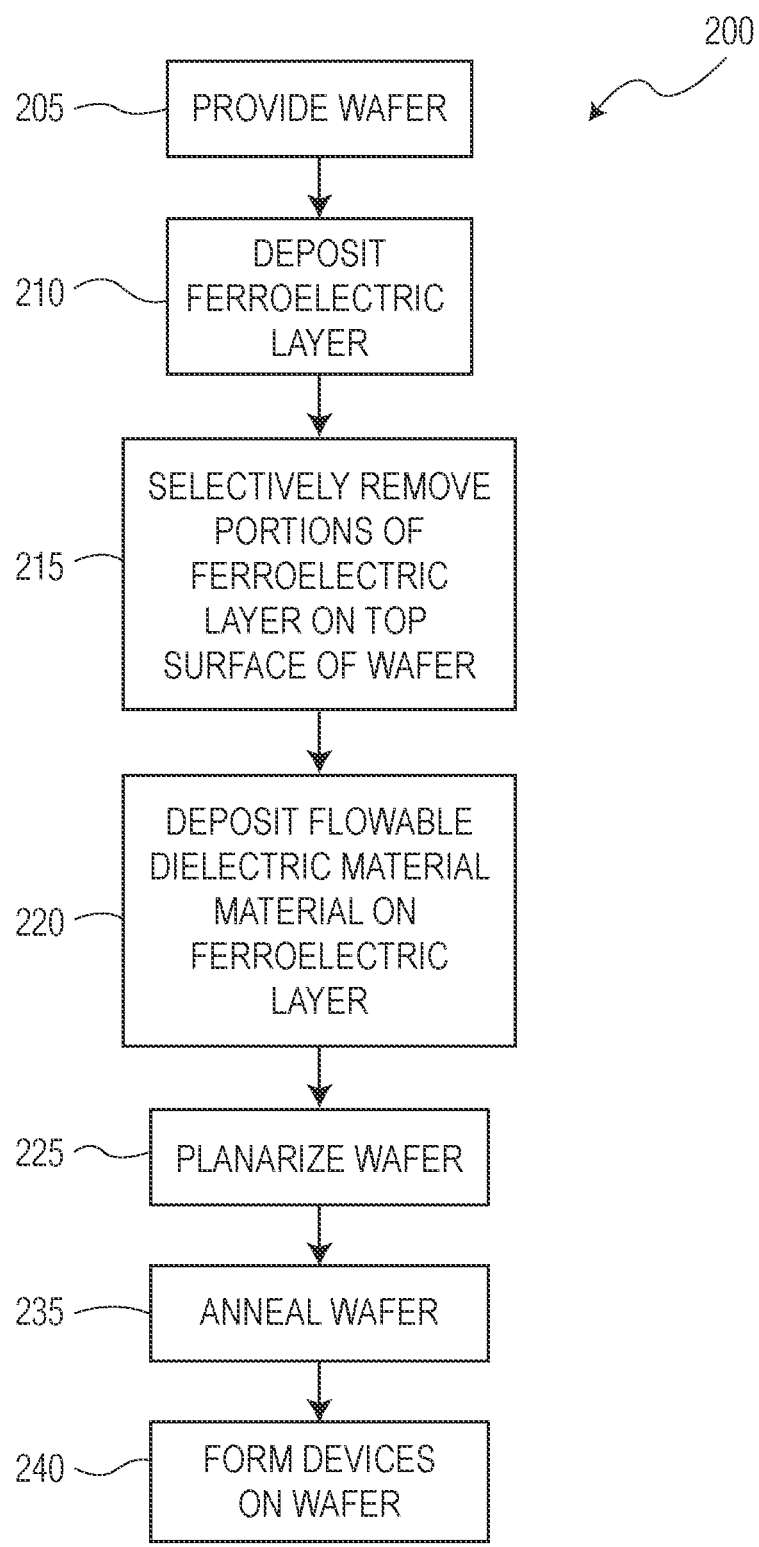
FIG. 2 is a method of forming a CTE mismatched layer on the semiconductor wafer illustrated in FIG. 1, according to an embodiment of the disclosure.

FIG. 2 illustrates steps associated with a method 200 of forming a ferroelectric layer on wafer 100 of FIG. 1, according embodiments of the disclosure. FIGS. 3A-3G illustrate simplified sequential views of cross-section 3-3 along dicing lane 110 shown in FIG. 1, according to method 200 described in FIG. 2. Method 200 describes a process involving selective removal of portions of a ferroelectric layer, resulting in reduced strain between the ferroelectric layer and the wafer, as described in more detail below.

In step 205 of FIG. 2 an appropriate semiconductor wafer is provided. In some embodiments the wafer can be silicon, however in other embodiments the wafer may be, silicon on insulator (SOI), silicon with one or more pre-deposited layers, germanium, silicon germanium, gallium arsenide, silicon carbide, gallium nitride, CVD diamond or any other type of semiconducting or dielectric material. In some embodiments the wafer may be any suitable diameter, including but not limited to any of the common standards such as, 150, 200, 300, 450 millimeters. In some embodiments, the techniques disclosed herein may be beneficial for wafers having a generally larger diameter as film strain increases over larger distances, however the techniques disclosed herein are not limited to any particular size of wafer as film stresses are also determined by the CTE mismatch between the materials.

Figure 3A:
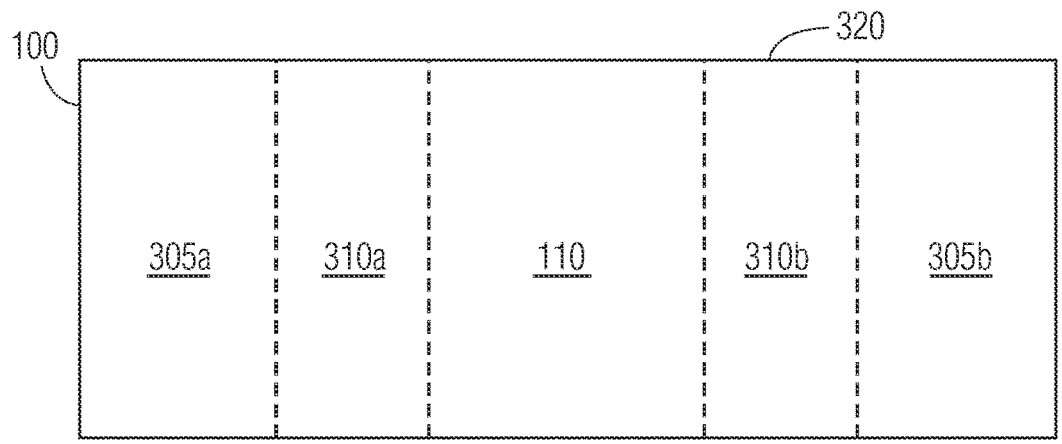
FIGS. 3A-3G illustrate simplified sequential cross-sectional views of the wafer shown in FIG. 1 during the formation of a CTE mismatched film, according to the method described in FIG. 2.

Referring to FIG. 3A, a cross-section through dicing lane 110 (see FIG. 1) of wafer 100 is illustrated. Cross-section 3-3 shows a portion of a first die 305a and a portion of a second die 305b. First die 305a has first die frame 310a and second die 305b has second die frame 310b. First and second die frames 310a, 310b, respectively, are inactive areas surrounding a periphery of each respective die that provide a predetermined setback for singulation operations, locations for wafer fabrication metrology structures and/or other features.

Dicing lane 110 is illustrated between first die frame 310a and second die frame 310b and is typically a "kerf" width of a dicing blade that can be any suitable width. In some embodiments a width of dicing lane 110 is between 10 microns and 500 microns, while in other embodiments the dicing lane is between 50 microns and 100 microns. In some embodiments wafer 100 is between 0.1 and 10 millimeters thick, while in other embodiments the wafer is between 0.5 and 1 millimeter thick and in further embodiments the wafer is approximately 0.7 millimeters thick.

Figure 3B:
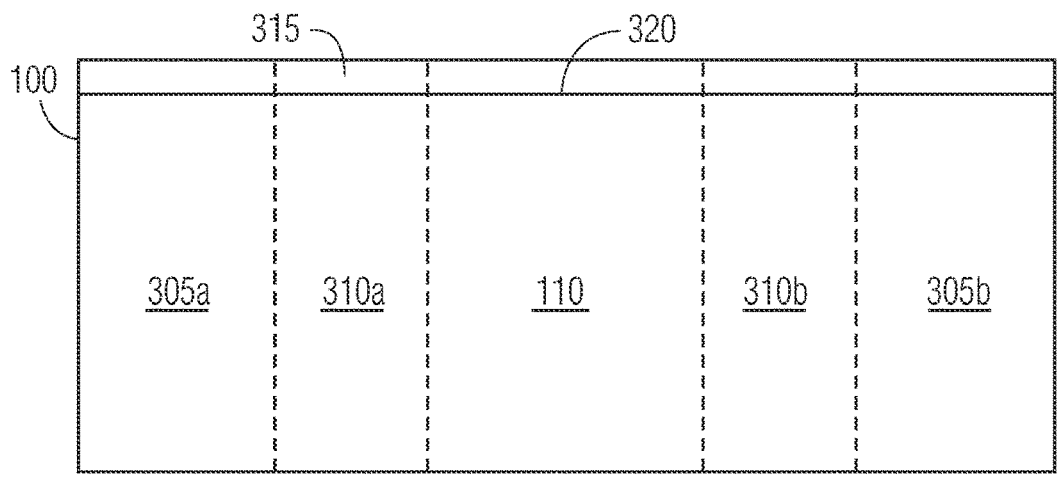

In step 210 of FIG. 2, a ferroelectric layer is deposited on the wafer using any appropriate deposition technique. Referring to FIG. 3B, ferroelectric layer 315 is formed on a top surface 320 of wafer 100. In some embodiments ferroelectric layer 315 includes a first seed layer of strontium titanate (e.g., $SrTiO_3$) followed by a layer of barium titanate (e.g., $BaTiO_3$), barium strontium titanate (e.g., $BaO_4SrTi$) or other ferroelectric layer including lead zirconate titanate (PZT) or lead lanthanum zirconate titanate (PLZT). In various embodiments ferroelectric layer 315 is deposited as an epitaxial layer on wafer 100. Any suitable deposition technique can be used to deposit ferroelectric layer 315 on wafer 100. In some embodiments ferroelectric layer 315 is between 50 and 2000 nanometers thick, while in other embodiments the ferroelectric layer is between 400 and 600 nanometers thick and in further embodiments the first ferroelectric layer is approximately 525 nanometers thick.

Figure 3C:
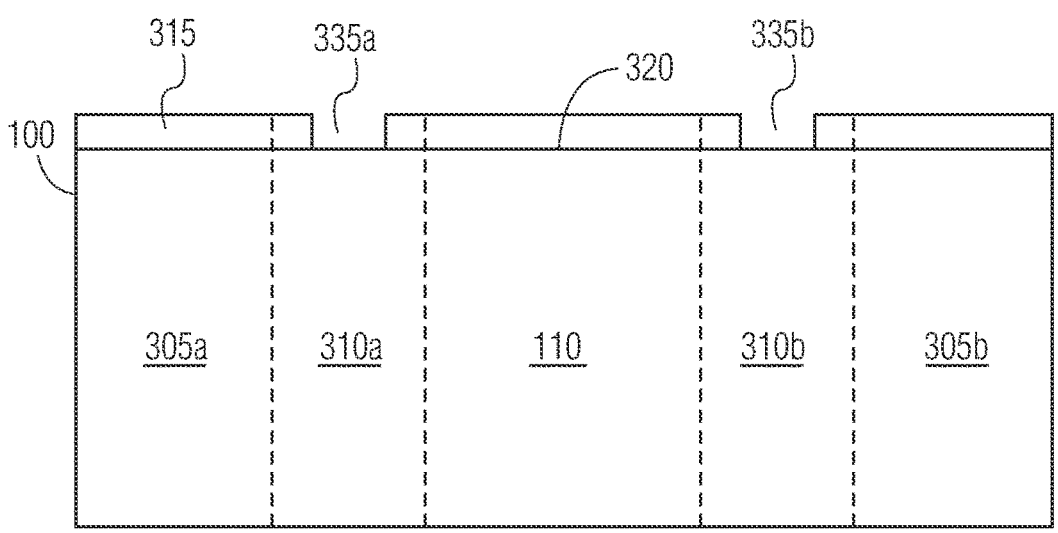

In step 215 of FIG. 2, one or more portions of the ferroelectric layer are selectively removed. Referring to FIG. 3C, a first portion 335a and a second portion 335b of ferroelectric layer 315 are removed. In this embodiment, first portion 335a is directly over first die frame 310a and second portion 335b is directly over second die frame 310b, however in other embodiments portions of the ferroelectric layer can be removed in different locations, as described in more detail in FIG. 4. In some embodiments first and second portions 335a, 335b, respectively, can be removed using a semiconductor wafer dicing saw that is set at a depth of ferroelectric layer 315, or deeper. However, in other embodiments any type of wet or dry etching process, laser ablation process or other suitable process can be used to remove first and second portions 335a, 335b, respectively. In some embodiments a width of first and second portions 335a, 335b, respectively, is between 10 microns and 500 microns, while in other embodiments the width is between 50 microns and 100 microns and in one embodiment the width is approximately 70 microns. In this particular embodiment strips of ferroelectric layer 315 are removed along every dicing lane 110 (see FIG. 1) that exists between each die 105, however in other embodiments the strips can be removed between every other die, every third, fourth or fifth die or at any other suitable spacing. In some embodiments, removing ferroelectric layer 315 along each dicing lane 110 can reduce a dimension of the ferroelectric layer by 10 times, resulting in reduced strain between the ferroelectric layer and wafer 100.

As appreciated by one of skill in the art having the benefit of this disclosure, selective removal of strips of first ferroelectric layer 315 reduces the accumulation of stress that builds up between CTE mismatched layers, such as ferroelectric layer 315 and silicon wafer 100. It will also be appreciated that the removal of strips of ferroelectric layer 315 that are oriented in a perpendicular relationship to each other (e.g., along dicing lanes 110 shown in FIG. 1) will relieve stress in all directions that accumulates across the surface of the wafer. In some embodiments, where the CTE mismatch is relatively large, the spacing between the strips of removed material may be reduced while in embodiments that have lower CTE mismatch the spacing between the strips may be increased. Further, in some embodiments the spacing between the strips located proximate a center of the wafer may be greater than the spacing at the edges of the wafer as the film strain can accumulate from the center (e.g., neutral axis) of the wafer. In yet further embodiments, the strips may not be aligned with the dicing lanes and may be positioned at other suitable locations on the wafer, for example, aligned with geometry of features formed on each die, as described in more detail in FIG. 4.

Figure 3D:
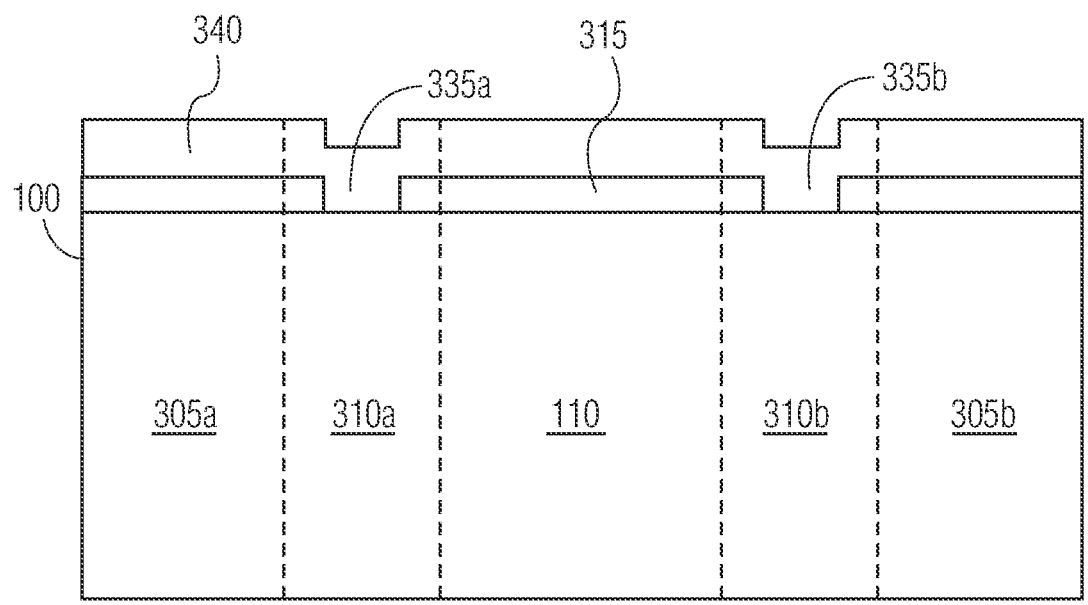

In step 220 of FIG. 2, a flowable dielectric material is deposited on the ferroelectric layer. Referring to FIG. 3D, flowable dielectric material 340 is deposited on ferroelectric layer 315. In some embodiments flowable dielectric material 340 may be what is known as a flowable silicon dioxide that can flow at relatively low temperatures (e.g., approximately 400° C.), however in other embodiments it may be a "high quality" silicon dioxide material that flows at relatively higher temperatures (e.g., 600-650° C.). In other embodiments flowable dielectric material 340 may be phosphosilicate glass (PSG) or borophosphosilicate glass (PBSG). Any suitable flowable dielectric material can be used to fill first and second portions 335a, 335b, respectively, such as, for example SiOC or SiON. In some embodiments flowable dielectric material 340 can be deposited via spin coating, high-plasma-density deposition, a thermal or PECVD process, or other suitable deposition method.

Figure 3E:
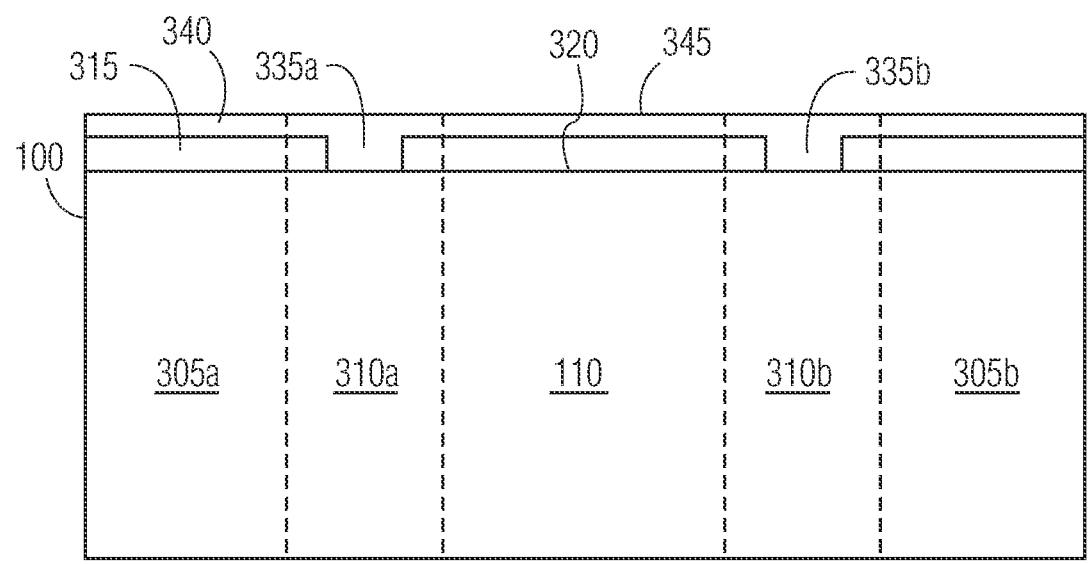

In step 225 of FIG. 2, the wafer is planarized. Referring to FIG. 3E, wafer 100 is planarized to remove excess dielectric material 340 such the dielectric material has a planar top surface 345. In some embodiments planarization can be performed using chemical mechanical polishing (CMP), however any other suitable process such as, for example, wet or dry etching can be used.

Figure 3F:
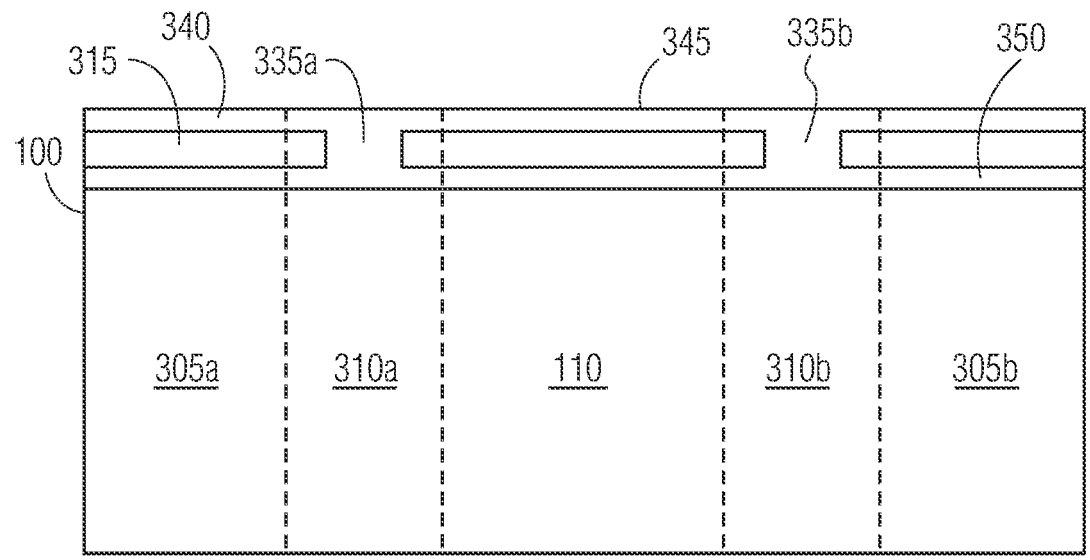

In step 235 a heat treatment or annealing process is performed on wafer 100 which can be conducted in an oxidizing environment. Referring to FIG. 3F, wafer 100 is heated and in some embodiments is heated in an oxidizing environment (e.g., environment that includes one or more species of oxygen (e.g., O, $O_2$, $O_3$). As a result of the heating, in some embodiments the crystallinity of ferroelectric layer 315 is improved and/or the quality of flowable dielectric material 340 is improved. In further embodiments, as a result of the heating, an intermediate layer 350 can be formed between top surface 320 of wafer 100 and a bottom surface of ferroelectric layer 315. In some embodiments intermediate layer 350 comprises silicon dioxide which can at least partially relieve stress between flowable dielectric material 340 and wafer 100 due to softening of the silicon dioxide at elevated temperatures experienced during the heat treating/annealing. In yet further embodiments, as a result of the heating the interface between ferroelectric layer 315 and wafer 100 can be stabilized and/or intrinsic stress in the wafer and/or ferroelectric layer from the epitaxial growth process can be reduced. In some embodiments the heat treatment is performed at a temperature between 700° C. and 1200° C., while in some embodiments it is performed at a temperature between 750° C. and 900° C. and in one embodiment is performed at approximately 800° C.

Figure 3G:
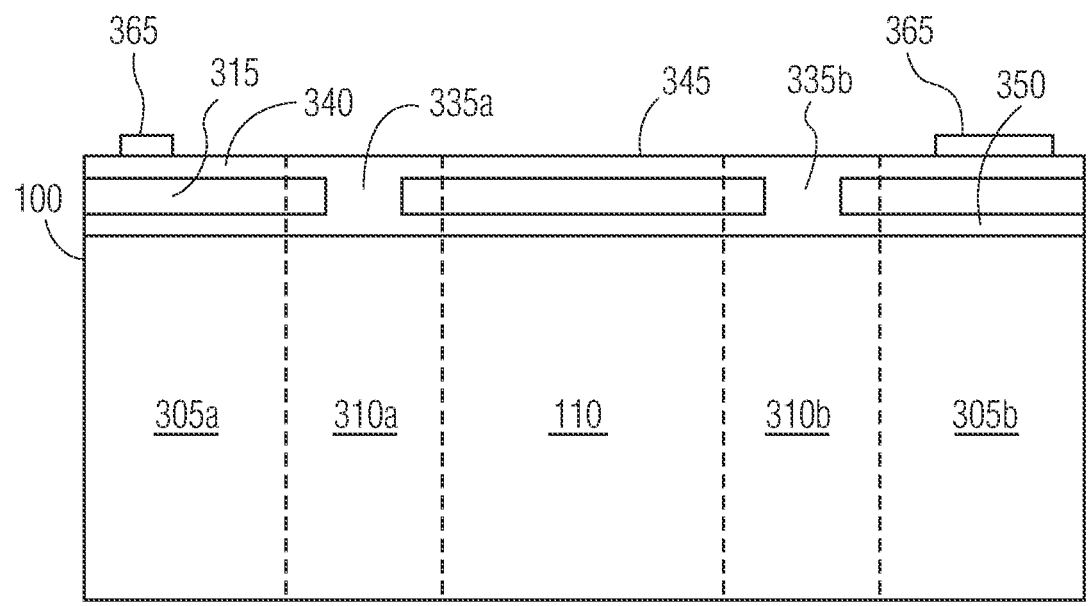

In step 240 of FIG. 2, one or more devices are formed on the wafer. In some embodiments the one or more devices are formed on the flowable dielectric material, while in other embodiments the flowable dielectric layer can be removed and replaced by one or more different dielectric materials that may have different qualities and/or characteristics. Referring to FIG. 3G, in this particular embodiment, devices 365 are formed on flowable dielectric material 340 and are positioned over regions of dies 305a, 305b that include ferroelectric layer 315. In some embodiments devices 365 can be one or more optical components, such as, for example an optical switch. In various embodiments, ferroelectric layer 315 is only positioned in regions of dies 305a, 305b that include components that utilize the properties of ferroelectric layer 315, as described in more detail in FIG. 4.

It will be appreciated that method 200 is illustrative and that variations and modifications are possible. Steps described as sequential may be executed in parallel, order of steps may be varied, and steps may be modified, combined, added or omitted. Some examples of process variants are illustrated below.

Figure 4:
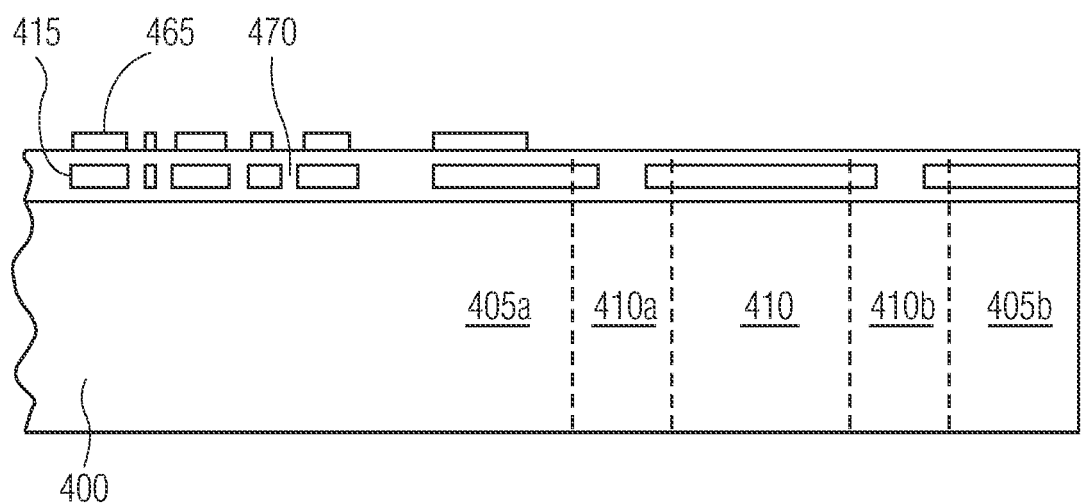
FIG. 4 illustrates a simplified cross-sectional views of a wafer having a CTE mismatched film with gaps that are distributed across an active region of a die, according to the method described in FIG. 2.

FIG. 4 illustrates a simplified view of a cross-section of a wafer that is similar to wafer 100, shown in FIG. 1, however in this embodiment, a larger portion of a die is shown, illustrating regions of the ferroelectric layer that have been removed within the active die area to relive stress between the ferroelectric layer and the wafer, according to method 200 described in FIG. 2. As shown in FIG. 4, first die 405a has first die frame 410a and second die 405b has second die frame 410b. First and second die frames 410a, 410b, respectively, are inactive areas surrounding a periphery of each respective die active area and provide a predetermined setback for singulation operations, locations for wafer fabrication metrology structures and/or other features.

Dicing lane 410 is illustrated between first die frame 410a and second die frame 410b and is typically a "kerf" width of a dicing blade that can be any suitable width. An active area of die 405a is shown extending to the left of first die frame 410a. The active area includes ferroelectric layer 415 that includes regions 470 where the ferroelectric layer has been removed. More specifically, regions 470 are distributed across die 405 active area and relieve stress that may accumulate between ferroelectric layer 415 and wafer 400. Devices 465 are formed on die 405a and may be aligned with regions of ferroelectric layer 415. Intermediate layer 450 is formed between ferroelectric layer 415 and wafer 400. In some embodiments, removing ferroelectric layer 415 within the active area of each die distributed across the wafer, the dimension of the ferroelectric layer can be reduced by 100 times, resulting in reduced strain between the ferroelectric layer and the wafer.

Figure 5A:
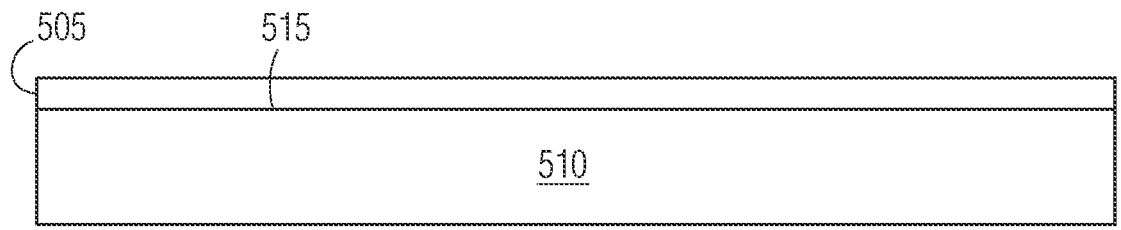
FIGS. 5A-5D illustrate steps associated with a method of depositing a CTE mismatched film on a semiconductor substrate, according to an embodiment of the disclosure.

FIGS. 5A-5D illustrate steps associated with a method of depositing a film on a semiconductor substrate that is similar to method 200 illustrated in FIG. 2, however, in this embodiment annealing (step 235) is performed after portions of ferroelectric layer on top surface of wafer are selectively removed (step 215), as described in more detail below. More specifically, as shown in FIG. 5A, a ferroelectric layer 505 is deposited on a top surface 515 of wafer 510 using any appropriate deposition technique. In some embodiments ferroelectric layer 505 includes a first seed layer of strontium titanate (e.g., $SrTiO_3$) followed by a layer of barium titanate (e.g., $BaTiO_3$), barium strontium titanate (e.g., $Ba_{1-x}Sr_xTiO_3$) or other ferroelectric layer. In various embodiments ferroelectric layer 505 is deposited as an epitaxial layer on wafer 510. Any suitable deposition technique can be used to deposit ferroelectric layer 505 on wafer 510.

Figure 5B:
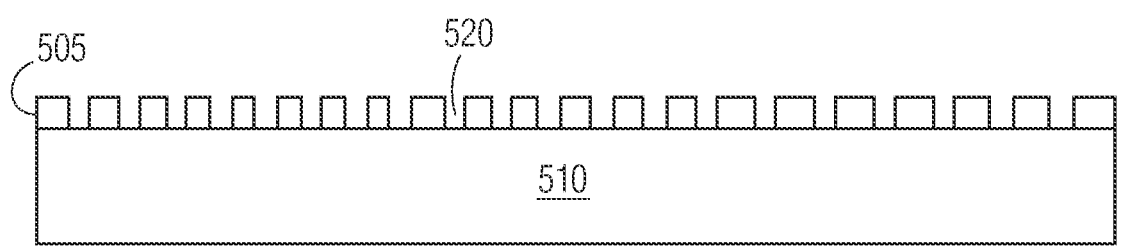

In FIG. 5B one or more portions 520 of ferroelectric layer 505 are selectively removed. In this embodiment, one or more portions 520 that are removed are on an active region of one or more die distributed across wafer 510. In some embodiments one or more portions 520 can be removed using a semiconductor wafer dicing saw that is set at a depth of ferroelectric layer 505, or deeper. However, in other embodiments any type of wet or dry etching process, laser ablation process or other suitable process can be used to remove one or more portions 520.

Figure 5C:
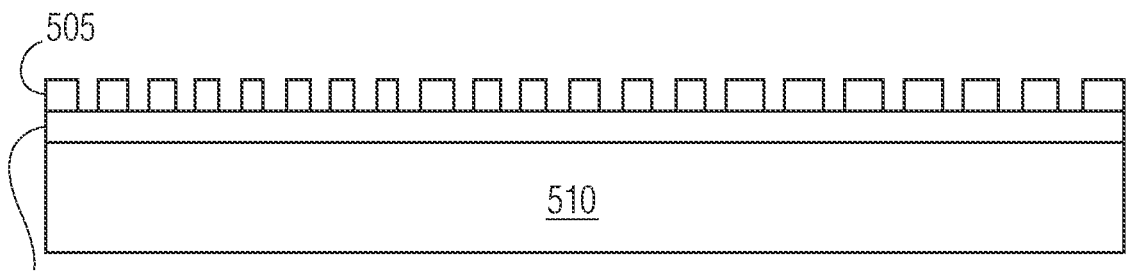

In FIG. 5C a heat treatment or annealing process is performed on wafer 510 which can be conducted in an oxidizing environment. Wafer 510 is heated and in some embodiments is heated in an oxidizing environment (e.g., environment that includes one or more species of oxygen (e.g., O, $O_2$, $O_3$). As a result of the heating, in some embodiments the crystallinity of ferroelectric layer 505 is improved. In further embodiments, as a result of the heating, an intermediate layer 525 can be formed between top surface 515 of wafer 510 and a bottom surface of ferroelectric layer 505. More specifically, in some embodiments the oxidizing atmosphere can react with top surface 515 of wafer 510 and convert it to an oxide (e.g., silicon dioxide). In some embodiments intermediate layer 525 comprises silicon dioxide which can at least partially relieve stress between ferroelectric layer 505 and wafer 510 due to softening of the silicon dioxide at elevated temperatures experienced during the heat treating/annealing. In yet further embodiments, as a result of the heating the interface between ferroelectric layer 505 and wafer 510 can be stabilized and/or intrinsic stress in the wafer and/or ferroelectric layer from the epitaxial growth process can be reduced.

Figure 5D:
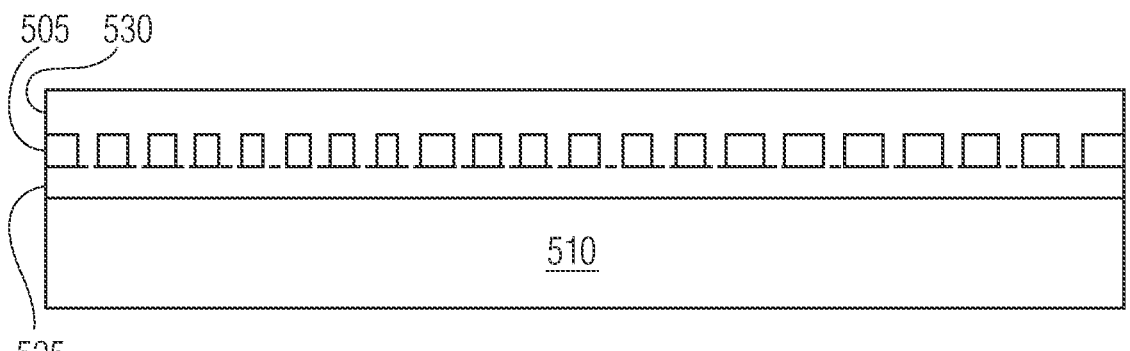

In FIG. 5D a flowable dielectric material 530 is deposited on the ferroelectric layer 505. In some embodiments flowable dielectric material 530 may be what is known as a flowable silicon dioxide that can flow at relatively low temperatures (e.g., approximately 400° C.), however in other embodiments it may be a "high quality" silicon dioxide material that flows at relatively higher temperatures (e.g., 600-650° C.). In other embodiments flowable dielectric material 530 may be phosphosilicate glass (PSG) or borophosphosilicate glass (PBSG). Any suitable flowable dielectric material can be used to fill one or more portions 520 of ferroelectric layer 505 that have been removed. In some embodiments flowable dielectric material 530 can be deposited via spin coating, high-plasma-density deposition, a thermal or PECVD process, or other suitable deposition method.

In some embodiments, after flowable dielectric material 530 is deposited the wafer is planarized to remove excess dielectric material and to form a planar top surface. In some embodiments planarization can be performed using chemical mechanical polishing (CMP), however any other suitable process such as, for example, wet or dry etching can be used. In some embodiments, after planarization one or more devices are formed on the wafer. In some embodiments the one or more devices are formed on flowable dielectric material 530, while in other embodiments the flowable dielectric material can be removed during the planarization process and replaced by one or more different dielectric materials that may have different qualities and/or characteristics.

It will be appreciated that the method described by FIGS. 5A-5D is illustrative and that variations and modifications are possible. Steps described in FIG. 2 and/or in the preceding description as sequential may be executed in parallel, order of steps may be varied, and steps may be modified, combined, added or omitted. Some examples of process variants are illustrated below.

Figure 6A:
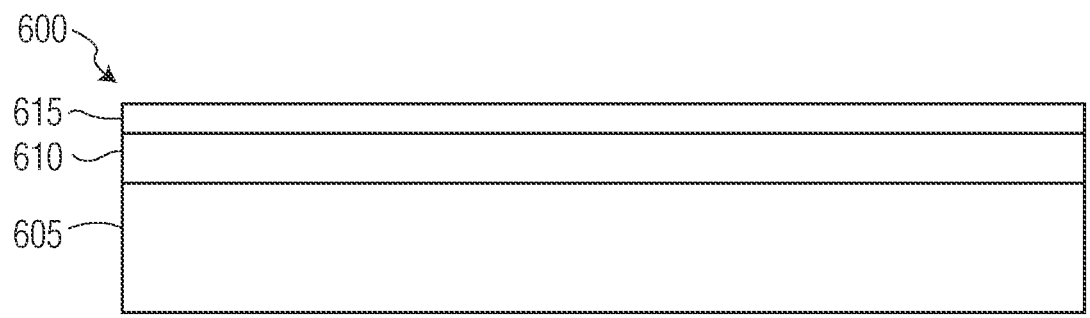
FIGS. 6A-6F illustrate steps associated with a method of depositing a CTE mismatched film on a SOI semiconductor substrate, according to an embodiment of the disclosure.

FIGS. 6A-6D illustrate steps associated with a method of depositing a film on a semiconductor substrate that is similar to method 200 illustrated in FIG. 2, however, in this embodiment a silicon-on-insulator (SOI) wafer is used and the annealing process (step 235) is performed after portions of ferroelectric layer are removed from top surface of wafer (step 215), as described in more detail below. More specifically, as shown in FIG. 6A, a silicon-on-insulator wafer 600 is provided that includes a silicon substrate 605, an insulative layer 610 (e.g., silicon dioxide) and a top layer 615 of silicon.

Figure 6B:
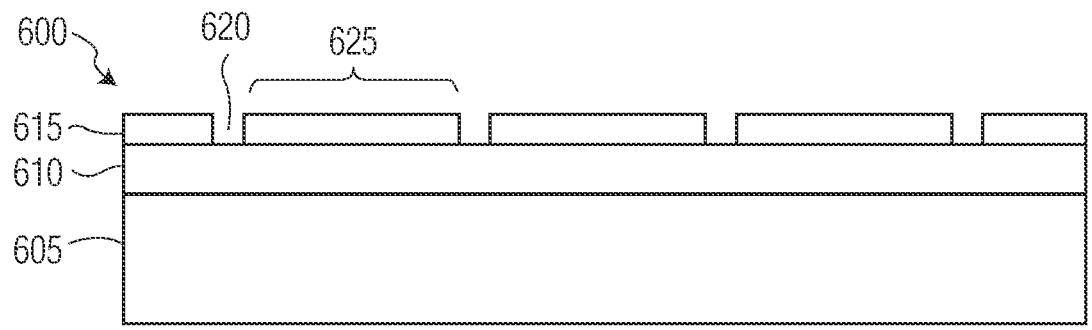

In FIG. 6B regions 620 of top layer 615 are removed. In some embodiments regions 620 are positioned at a frame surrounding die 625 and/or in kerf areas, however in other embodiments they can be or may additionally be positioned within active regions of the die, as described in more detail above.

Figure 6C:
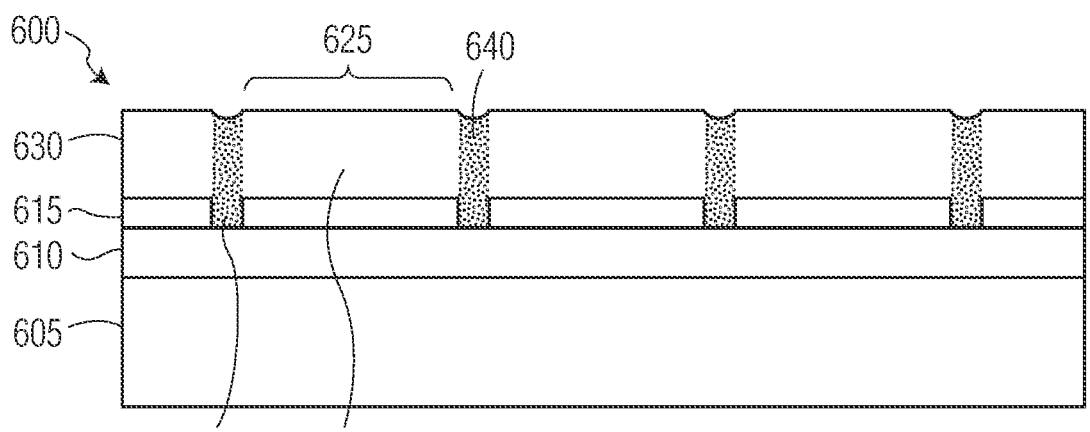

In FIG. 6C, a ferroelectric layer 630 is deposited on the top layer 615 using any appropriate deposition technique. In some embodiments ferroelectric layer 630 includes a first seed layer of strontium titanate (e.g., $SrTiO_3$) followed by a layer of barium titanate (e.g., $BaTiO_3$), barium strontium titanate (e.g., $Ba_{1-x}Sr_xTiO_3$) or other ferroelectric layer. In various embodiments ferroelectric layer 630 is deposited as an epitaxial crystalline region 635 on regions of top layer 615 that are remaining, however in regions 620 where the top layer has been removed, the ferroelectric layer is deposited as a polycrystalline region 640. Any suitable deposition technique can be used to deposit ferroelectric layer 630 on top layer 615.

Figure 6D:
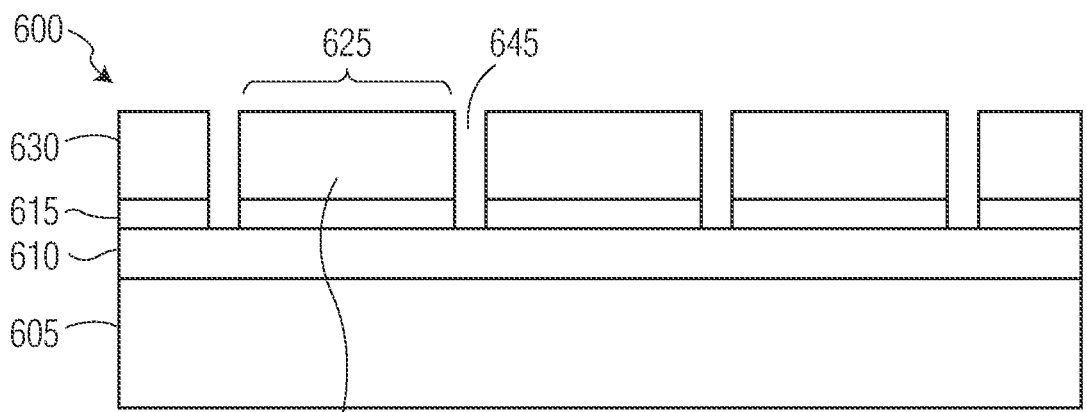

In FIG. 6D one or more portions 645 of ferroelectric layer 630 are selectively removed. In this embodiment, one or more portions 645 of ferroelectric layer 630 that are removed are polycrystalline regions 640. In some embodiments one or more portions 645 are removed using a semiconductor wafer dicing saw that is set at a depth of insulative layer 610, or deeper. However, in other embodiments any type of wet or dry etching process, laser ablation process or other suitable process can be used to remove one or more portions 645.

Figure 6E:
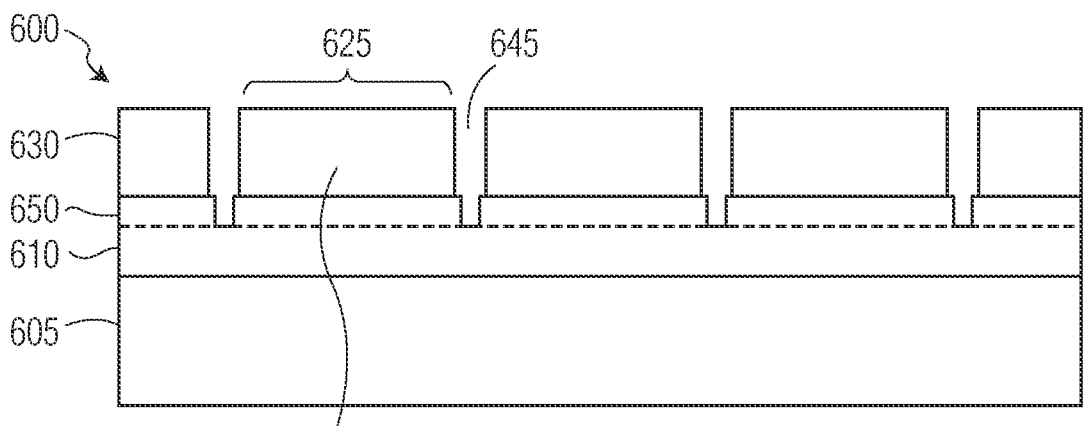

In FIG. 6E a heat treatment or annealing process is performed on wafer 600 which can be conducted in an oxidizing environment. Wafer 600 is heated and in some embodiments is heated in an oxidizing environment (e.g., environment that includes one or more species of oxygen (e.g., O, $O_2$, $O_3$). As a result of the heating, in some embodiments the crystallinity of ferroelectric layer 630 is improved. In further embodiments, as a result of the heating, top layer 615 of silicon (see FIG. 6A) can be oxidized to form an intermediate oxide layer 650 that attached to insulative layer 610. In some embodiments intermediate layer 650 comprises silicon dioxide that is fused with silicon dioxide of insulative layer 610 forming a silicon dioxide region which can at least partially relieve stress between ferroelectric layer 630 and silicon substrate 605 due to softening of the silicon dioxide at elevated temperatures experienced during the heat treating/annealing. In yet further embodiments, as a result of the heating the interface between ferroelectric layer 630 and silicon substrate 605 can be stabilized and/or intrinsic stress in the wafer and/or ferroelectric layer from the epitaxial growth process can be reduced.

Figure 6F:
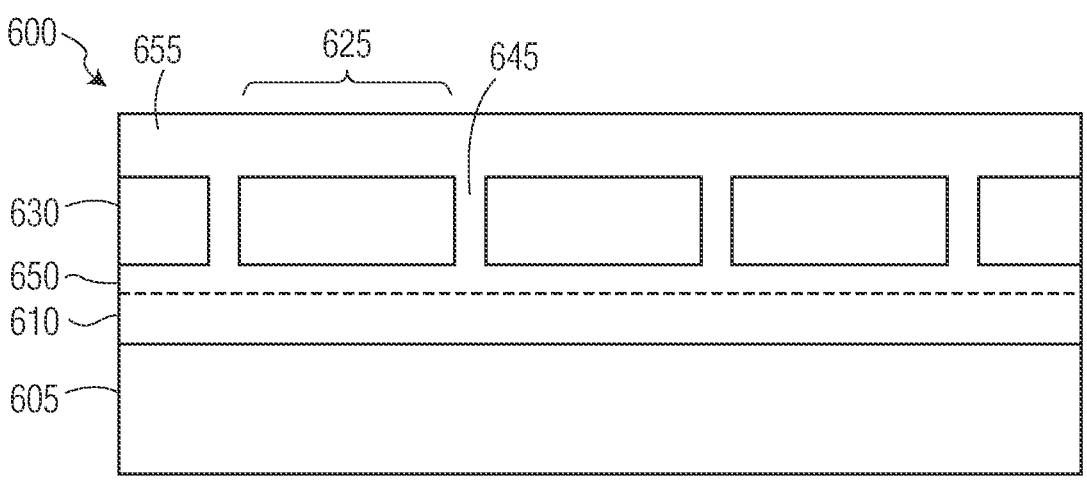

In FIG. 6F a flowable dielectric material 655 is deposited on ferroelectric layer 630. In some embodiments flowable dielectric material 655 may be what is known as a flowable silicon dioxide that can flow at relatively low temperatures (e.g., approximately 400° C.), however in other embodiments it may be a "high quality" silicon dioxide material that flows at relatively higher temperatures (e.g., 600-650° C.).

In other embodiments flowable dielectric material 655 may be phosphosilicate glass (PSG) or borophosphosilicate glass (PBSG). Any suitable flowable dielectric material can be used to fill one or more portions 645 (see FIG. 6E). In some embodiments flowable dielectric material 655 can be deposited via spin coating, high-plasma-density deposition, a thermal or PECVD process, or other suitable deposition method.

In some embodiments, after the flowable dielectric material 655 is deposited the wafer is planarized to remove excess dielectric material and to form a planar top surface. In some embodiments planarization can be performed using chemical mechanical polishing (CMP), however any other suitable process such as, for example, wet or dry etching can be used. In some embodiments, after planarization one or more devices are formed on the wafer. In some embodiments the one or more devices are formed on flowable dielectric material 655, while in other embodiments the flowable dielectric layer can be removed during the planarization process and replaced by one or more different dielectric materials that may have different qualities and/or characteristics.

It will be appreciated that the method described by FIGS. 6A-6F and FIG. 2 is illustrative and that variations and modifications are possible. Steps described as sequential may be executed in parallel, order of steps may be varied, and steps may be modified, combined, added or omitted. Some examples of process variants are illustrated below.

For simplicity, various process steps that include cleaning, drying, annealing and the like are not described but would be apparent to one of ordinary skill in the art having the benefit of this disclosure and are within the scope of this disclosure.

In the foregoing specification, embodiments of the disclosure have been described with reference to numerous specific details that can vary from implementation to implementation.

The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. A method comprising:
   depositing a ferroelectric layer on a top surface of a semiconductor wafer;
   forming one or more gaps in the ferroelectric layer;
   depositing a first dielectric layer over the ferroelectric layer;
   planarizing the first dielectric layer; and
   forming a second dielectric layer between the ferroelectric layer and the semiconductor wafer.

2. The method of claim 1 wherein the semiconductor wafer comprises a silicon wafer.

3. The method of claim 1 wherein the one or more gaps are formed in the ferroelectric layer using a dicing saw or an etching process.

4. The method of claim 1 wherein the one or more gaps are formed in the ferroelectric layer along one or more dicing lane regions.

5. The method of claim 1 wherein the one or more gaps are formed in the ferroelectric layer within one or more active regions of one or more semiconductor die defined across the semiconductor wafer.

6. The method of claim 1 wherein the second dielectric layer is formed during a heat treating process in an oxidizing atmosphere.

7. The method of claim 1 wherein the first dielectric layer comprises flowable silicon dioxide.

8. The method of claim 1 wherein the second dielectric layer comprises silicon dioxide.

9. The method of claim 1 wherein the semiconductor wafer comprises a silicon-on-insulator series of layers.

10. The method of claim 1 wherein the ferroelectric layer comprises barium titanate.

\* \* \* \* \*